United States Patent
Tiefert

[11] 3,947,298
[45] Mar. 30, 1976

[54] METHOD OF FORMING JUNCTION REGIONS UTILIZING R.F. SPUTTERING

[75] Inventor: Karl H. Tiefert, Los Altos, Calif.

[73] Assignee: Raytheon Company, Lexington, Mass.

[22] Filed: June 2, 1975

[21] Appl. No.: 582,941

Related U.S. Application Data

[60] Continuation of Ser. No. 436,407, Jan. 25, 1974, abandoned, which is a division of Ser. No. 242,512, April 10, 1972, abandoned.

[52] U.S. Cl. ............... 148/175; 29/576 R; 29/578; 29/590; 148/187; 156/6; 156/7; 156/17; 204/192; 219/121 EB; 219/121 EM; 357/50; 357/51; 357/52; 357/65
[51] Int. Cl.² .............. H01L 21/283; H01L 21/302
[58] Field of Search ............ 148/175, 187; 156/2, 5, 156/6, 7, 16, 17; 29/576, 578, 590; 204/192; 219/121 EB, 121 EM; 357/50, 51, 52, 65

[56] References Cited
UNITED STATES PATENTS

| | | | |
|---|---|---|---|
| 3,472,689 | 10/1969 | Scott .................................. | 156/17 X |
| 3,475,234 | 10/1969 | Kerwin et al. ..................... | 156/17 X |
| 3,479,237 | 11/1969 | Bergh et al. ........................ | 156/17 X |
| 3,598,710 | 8/1971 | Davidse ............................. | 204/192 |
| 3,615,874 | 10/1971 | Lepselter et al. .................. | 148/187 X |
| 3,640,811 | 2/1972 | Vossen ............................... | 204/192 |
| 3,731,372 | 5/1973 | Kraft .................................. | 29/590 |
| 3,818,289 | 6/1974 | Mudge et al. ...................... | 357/49 |
| 3,836,446 | 9/1974 | Tiefert ............................... | 204/192 |

OTHER PUBLICATIONS
Valletta, R. M., "Control of Edge Profile in Sputter Etching," I.B.M. Tech. Discl. Bull., Vol. 10, No. 12, May 1968, p. 1974.

Larkin et al., "Electron Beam Fabrication . . . Transistors" Solid–State Electronics, Vol. 10, 1967, pp. 491–496.

*Primary Examiner*—L. Dewayne Rutledge
*Assistant Examiner*—W. G. Saba
*Attorney, Agent, or Firm*—John R. Inge; Joseph D. Pannone; Milton D. Bartlett

[57] ABSTRACT

A semiconductor integrated circuit in which accurate location of emitter contacts on diffused emitter regions is achieved by using an apertured multilayered mask on the surface of a semiconductor body through which the impurity forming the emitter region is diffused into the body from an oxidizing atmosphere such that the emitter region diffuses laterally to form junctions beyond the edges of said apertures and beneath the mask for a distance which is a function of the depth of the junctions and the coating formed during the diffusion process is removed by R.F. sputtering which removes the emitter oxide without substantially undercutting the oxide layer beneath the nitride barrier layer of the emitter mask so that the junction on the surface of the semiconductor body produced by the lateral diffusion of the emitter region remains covered by the surface passivating oxide layer. Structures having microminiature emitter areas and depths with and without preferentially etched isolation regions are disclosed.

19 Claims, 4 Drawing Figures

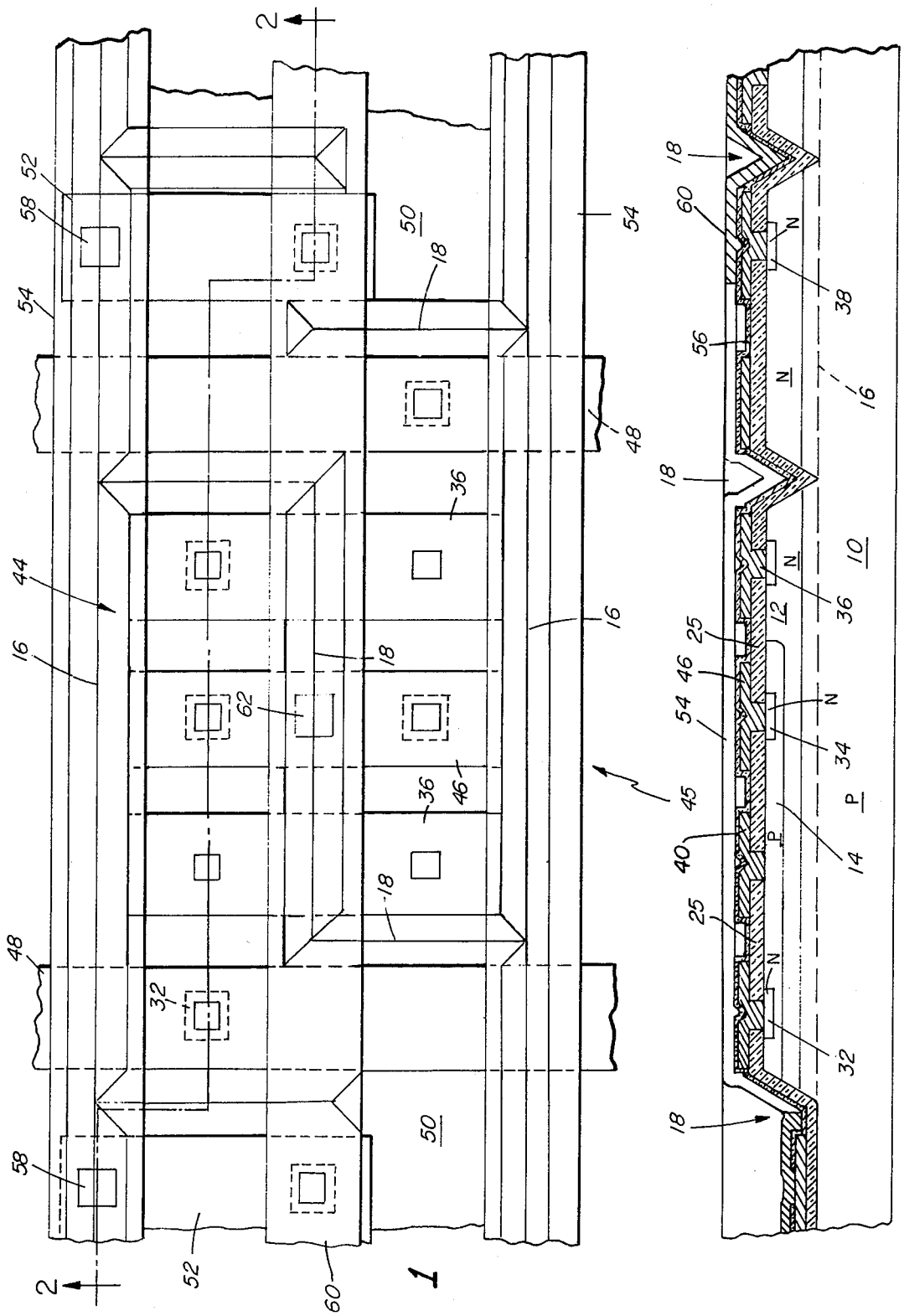

3,947,298

METHOD OF FORMING JUNCTION REGIONS UTILIZING R.F. SPUTTERING

CROSS REFERENCE TO RELATED APPLICATIONS

This is a continuation of application Ser. No. 436,407 filed Jan. 25, 1974, now abandoned, which is a division of application Ser. No. 242,512 filed Apr. 10, 1972 (now abandoned).

Application Ser. No. 290,593, entitled "Semiconductor Devices Manufacture", filed Sept. 20, 1972 (now U.S. Pat. No. 3,836,446) by Karl H. Tiefert, which is a division of application Ser. No. 141,857 filed May 10, 1971 (now abandoned), and assigned to the same assignee as this application, is hereby incorporated herein by reference and made a part of this disclosure.

BACKGROUND OF THE INVENTION

The production of semiconductor devices such as integrated circuits or microwave transistors, in general, requires that diffused semiconductor regions of one conductivity type be formed in a body of another conductivity type, thereby producing a junction line on the surface of the body. Since contacts must subsequently be made to the diffused region, reduction in size of such devices is limited by the fact that the contact cannot touch both sides of the junction or it will short out the junction.

It has been well known to mask a semiconductor body with a layer of dielectric material and to diffuse the regions through apertures of the mask. Due to lateral diffusion, the junction line is formed underneath the mask and the distance from the mask opening is a function of the time allowed for the diffusion process which also controls the distance into the body which the junction moves. It has heretofore been necessary to diffuse such junctions sufficiently deeply into the body, for example greater than one micron deep, to produce a junction on the surface of the body over one micron from the edge of the mask. Otherwise, the layer of oxide and/or other material which is formed on the surface of the semiconductor in the wash apertures during such emitter diffusion and which was removed by a chemical etch which proceeds in all directions through the oxide would undercut the oxide mask enough to uncover and thus spoil the junction. This additional lateral diffusion requirement in turn results in a production requirement that additional space on the semiconductor chip must be reserved to prevent the junction from interfering with the next adjacent semiconductor element or isolation region and, hence, restricts the number of junctions which can, as a practical matter, be formed on a given area of semiconductor surface. In addition, the additional depth of the junction reduces control of the thickness of the base region and, hence, for production purposes, limits the upper frequency response of a circuit on a chip containing a substantial number of interconnected semiconductor elements.

Alternatively, multiple masking steps to produce an emitter junction area of one size and a smaller mask aperture for subsequent formation of emitter contacts requires very precise mask locationing of the subsequent masks.

SUMMARY OF THE INVENTION

This invention provides for a semiconductor system in which shallow semiconductor regions may be diffused into a body of semiconductor material through apertures in a dielectric mask so that the junction regions are very close to the edge of the mask apertures and the oxide layer formed on the diffusion region during the diffusion process may be removed by sputtering which produces no substantial undercutting of the mask region. Hence, there is no substantial probability of exposure of the junction region.

More specifically, a body of silicon may be formed in accordance with conventional practice from a slice of a silicon ingot and have regions of high conductivity material diffused therein to provide collector contact regions underlying the individual semiconductor elements and an epitaxial layer forming collector regions grown over the entire face of the slice. Individual base regions may be diffused through a mask in the desired areas as shown. Alternatively, base regions of a predetermined thickness may be formed by diffusion across the entire face of the slice, and individual base regions may be separated by diffusion isolation or etched region isolation. Such base regions in the case of N type collector epitaxial layers are, for example, of P type material. Layers of thermally grown or sputter deposited oxide and/or thermally grown or sputter deposited silicon nitride protect the surface of the semiconductor, and a third layer of heavy oxide is formed on top of the nitride layer. Apertures for emitter diffusion and/or collector, base and passive component connections are formed through the masking layer of oxide by conventional photoresist masking techniques through which the heavy oxide layer is etched. Those apertures above regions such as base contact regions, or resistor contact regions, which are not to be subjected to diffusion, are additionally masked by conventional photoresist while the remaining layers of nitride and oxide are removed in those apertures, such as emitter and/or collector regions where diffusion is desired for emitter junctions and/or ohmic contacts to collectors or passive elements. Because of the extremely shallow emitter junction regions, the thickness of the base regions may be made small so that the depth from the surface to the high conductivity regions is equally reduced. Thus, the collector diffusion which further reduces the resistance of the epitaxial layer in the collector region between the collector contact and the high conductivity subcollector in many cases allows such contacts to be made to the semiconductor surface without an additional masking step for diffusion down to the subcollector region. Diffusion of the emitter regions and collector contact regions is performed at elevated temperature in an oxidizing atmosphere containing the diffusion impurity resulting in emitter regions whose junctions on the surface of the semiconductor body are slightly beneath the dielectric material mask.

In accordance with the invention, the semiconductor body is now processed to remove the nitride layer in the base and resistor regions by a chemical etch, which does not substantially affect the oxide, to expose the thermally grown oxide layer in the base contact, or the oxide in the emitter regions may be protected by a photoresist mask during removal of the base region nitride layer, and the photoresist is then stripped off.

The device is now subjected to sputter etching in an R.F. field utilizing a suitable target. Such sputtering is continued until the emitter oxide has been completely removed. Since such sputtering in a sputtering atmosphere of noble gas such as argon proceeds by impingement of ions which travel in substantially straight lines, the sputtered region exposed will be substantially the optical projection of the sputtering target through the apertures in the mask, and thus no substantial undercutting of the silicon nitride barrier layer will occur.

The sputtering process redeposits some of the material removed by sputtering on other regions of the body in a thin layer as well as material from the target electrode. Therefore, following the sputtering process, this material is removed by dipping the device in a wash which dissolves the titanium. In addition, this wash removes a few Angstroms of the thermally grown oxide immediately adjacent the semiconductor body which defines the periphery of the mask aperture through which the emitter diffusion occurred and thus removes a portion of the contaminated oxide.

The metal contacts to the emitter base and collector regions are formed in accordance with any desired practice such as sputter deposition in which any monomolecular layers of contaminants, such as oxides or other compounds which form on the exposed contact regions during the titanium removal wash process, are first removed by sputtering in an R.F. field in inert gas at reduced pressure to clean the surface and then depositing a layer of a material, such as platinum, on the device. Heating the device forms a compound with the silicon. For example, platinum forms platinum silicide, and the excess platinum is then removed with aqua regia which does not substantially etch the platinum silicide. It is contemplated that other metals besides platinum, such as molybdenum, chromium, tungsten, nickel, aluminum or alloys thereof and/or other metals, may be used to make the semiconductor metal contact, some of which need not form silicon compounds and in these cases the heating step to convert the metal to a silicon compound can be eliminated.

Metallization for interconnection of junction areas on active or passive semiconductor elements on the surface of the device may be made with a titanium-platinum-gold metallization system in accordance with the teaching of the above-referenced copending patent application. The present invention discloses that a second layer of such metallization may be made to strongly adhere to the oxide insulating layer between the metallization layers by first coating the silicon dioxide insulating layer with a sputtered layer of the oxides of titanium. A layer of metal such as gold is deposited on the sputtered layer of the oxides of titanium. It has been discovered that the gold layer firmly adheres to the sputtered layer. Subsequent layers of metal can now be deposited on the gold layer in accordance with the aforementioned copending patent application.

This invention further discloses that while the sputter etched emitter contacts may be used with any desired devices or systems, such as the formation of transistors, resistors, diodes, field effect devices, semiconductor photodiode arrays, camera tube targets or induced conductivity devices, it is particularly useful in those systems in which close spacing of components or emitter regions is desirable, such as high speed computer circuits or interdigital emitter structures for microwave transistors. This invention is particularly useful in those devices where adjacent active and/or passive semiconductor elements are isolated by removal of the semiconductor material by preferential etching. Furthermore, the system is extremely useful in the class of semiconductor devices where interconnecting conductive systems are supported on the surface of the semiconductor devices on insulating layers with contacts extending through the insulating layers to contact the desired regions of the semiconductor body and/or other conductive leads. More specifically, silicon bodies having surfaces lying in the [100] crystallographic plane may have adjacent regions isolated by etching the surfaces through mask openings with a preferential etch which proceeds in a direction along the <100> crystallographic axis at a rate substantially greater than in any other direction. By using rectilinear openings in the mask with the side of the mask openings preferably extending along the <110> crystallographic axes, smooth sloped walls may be formed extending along the [111] crystallographic planes. The smooth walls so formed have an angle with respect to the surface of 53° to 56° and, hence, conductive layers laid down, for example by sputtering, will uniformly deposit on the sloped walls.

BRIEF DESCRIPTION OF THE DRAWINGS

Other and further objects and advantages of this invention will be apparent as the description thereof progresses, reference being had to the accompanying drawings wherein:

FIG. 1 illustrates a plan position view of a particular integrated circuit embodying the invention;

FIG. 2 illustrates a transverse sectional view of the structure illustrated in FIG. 1 taken along line 2—2 of FIG. 1;

DESCRIPTION OF THE PREFERRED EMBODIMENT

Figure 3:
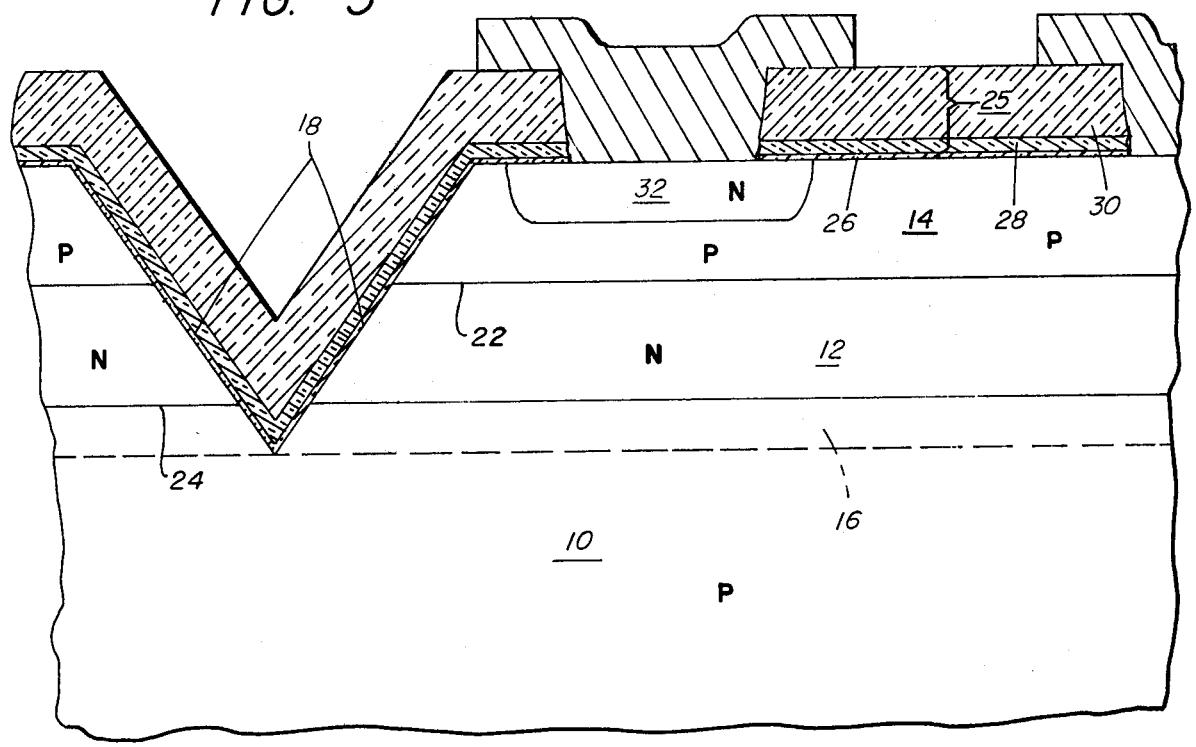
FIG. 3 illustrates an expanded view of a detail of FIG. 2.

Referring now to FIGS. 1, 2 and 3, there is shown a semiconductor body 10 which is a portion of a wafer of a semiconductor material sliced from an ingot grown along the <100> crystallographic axis. Preferably, body 10 is of P type material, such as silicon, doped with boron to a concentration greater than $10^{16}$ carriers per cubic centimeter, resulting in a bulk resistance on the order of 1 ohm centimeter. This resistance is made sufficiently low to minimize the inversion of the regions in the body 10 under the influence of electric fields which might destroy the isolation between elements formed in a layer deposited on the body 10 which acts as a substrate to hold the subsequently deposited layers and elements. Any desired material, such as an insulator, could be used for substrate 10. An N type epitaxial layer 12, between 1 and 5 microns and preferably approximately 2½ microns thick, is formed on the surface of body 10. If desired, regions on the chip which are to be used for other purposes may have high conductivity regions diffused into body 10 for use as subcollector regions.

The resistance of layer 12 preferably is substantially lower than the resistance of region 10. For example, the impurity concentration of layer 12 is preferably greater than $10^{16}$ carriers per cubic centimeter, and layer 12 preferably has a bulk resistance of about one-quarter of an ohm centimeter.

Diffused into epitaxially grown region 12 are a plurality of base regions 14 which preferably are diffused through an oxide mask, in accordance with well-known practice, to a depth of approximately 1 micron and preferably have a surface resistance on the order of 650 ohms per square centimeter. While, as illustrated herein, the regions 14 form the bases of a pair of elongated transistors whose elongated regions are parallel to each other, any desired configuration of transistor or other semiconductor element can be formed in accordance with this invention.

A plurality of longitudinal grooves 16 having walls lying substantially in the [111] crystallographic surface planes are preferentially etched through layer 12 and into substrate 10. As indicated herein, a plurality of preferentially etched grooves 18 form an S-shaped pattern connecting adjacent parallel grooves 16 and separating the semiconductor cell into two sections, each section having a transistor and associated resistors connected thereto. Grooves 16 and 18 expose portions 22 of the junction between the N type layer 12 and the P type base regions 14, as well as portions of the junction 24 between the substrate 10 of P type material and the N type epitaxial layer 12. Because the anisotropic etch forming of grooves produces flat walls having a predetermined angle of, for example, 54° to 56° with respect to the surface of the semiconductor body, the dimensions across the regions 14, parallel to the [100] surface, are accurately controlled by the positioning and size of the apertures in the mask used for the preferential etching. As illustrated herein, the width of the openings in the mask used to form the grooves is sufficient to cause the grooves to penetrate between one-half micron and one micron into the substrate 10, thereby producing sufficient spacing between the portions of the layer 12 on opposite sides of the groove to prevent conduction between such portions through inversion in the substrate 10 around the apex of the groove. The amount of penetration required depends on the application of the circuit and the value of resistance of the substrate 10 since higher resistance values would normally require a deeper penetration into the substrate 10 to prevent such conduction under all conditions of operation of the circuit.

Positioned on the surface of the structure is an insulating layer 25 which is made up of three layers. As shown in FIG. 3, layer 25 is made up of a first layer 26 of thermally grown oxide, preferably 500 Angstroms or so thick, a second layer 28 of silicon nitride, preferably formed by chemical vapor deposition and having a depth of approximately 1500 Angstroms, and a thrid layer 30 of silicon dioxide deposited by chemical vapor deposition, in accordance with well-known practice, and preferably having a depth on the order of 8000 Angstroms. Layer 28 can be of any desired material which acts as a barrier to contaminants, such as sodium. For example, aluminum oxide can be used.

Diffused into each of the base regions 14 are a plurality of N+ emitter junction regions 32 and 34, and diffused into layer 12 are ohmic collector contact regions 36 and resistor contact regions 38. A base contact 40 is also formed on the surfaces of the base regions 14.

Regions 32, 34, 36, 38 and 40 are formed by exposing the surface regions of layer 30 through which contacts are to be made through a photoresist mask and etching the exposed regions of layer 30 with a buffered hydrogen fluoride solution to expose the silicon nitride layer 28.

The regions where the N+ diffusion for emitters 32 and 34 and collector and resistor contacts 36 and 38 is to be made are then etched with a solution of hot phosphoric acid to remove the exposed silicon nitride layer 28, while the base regions 40 where an N+ layer is not to be made are covered with an additional layer of photoresist to prevent etching of the nitride layer in this region. The exposed regions of the oxide layer 26 beneath the nitride layer are then removed by a hydrogen fluoride solution, and all the photoresist layers are stripped off.

Regions 32, 34, 36 and 38 of N+ impurity are then diffused into the semiconductor body by any desired well-known process. For example, phosphorus type impurity may be diffused into these regions to form N+ regions having a surface resistance preferably on the order of 12 ohms per square centimeter.

The emitter regions are formed by diffusion by a low temperature process of under 1000° which produces an emitter depth of approximately one-half micron, or less if desired, which extends laterally for a distance of slightly greater than one-half micron beneath the edges of the openings of oxide layer 26. Since the emitter diffusion occurs in an oxidizing atmosphere, a layer of 300 to 1000 Angstroms of silicon dioxide is also formed over these regions but substantially no oxide is formed over the base region 40 covered by the silicon nitride layer.

To expose the base regions, the emitter and collector contact regions 32, 34, 36 and 38 are covered with a photoresist, and the regions 40 are exposed through apertures in the photoresist. Precision positioning of the photoresist mask is not necessary since the only requirement is that the areas 32, 34, 36 and 38 be covered with photoresist. The oxide which did not form to any substantial extent over the silicon nitride layer 28 is removed along with the silicon nitride layer by a hot phosphoric acid etch to expose the oxide layer 26. The photoresist is then stripped off and the remaining oxide layers 26 in all contact regions, including the oxide which was grown during the diffusion process, are removed by sputter washing. A high frequency signal is connected to a metal electrode which may, if desired, act as a substrate holder. The signal ground is the chamber, at least parts of which are metal, and the holder is insulated with respect to the chamber for direct current. Sputtering is continued by this process until the silicon regions are exposed. The wafer is then dipped in a solution of hydrogen fluoride to remove any metal such as titanium from the holder, which has redeposited on regions of the wafer. The wafer is then placed in a reduced pressure inert atmosphere and again sputtered in a high frequency field against an inert target to clean any contaminants deposited during the dip removal of the titanium, and a layer of platinum is then sputter deposited on all contact areas. The wafer is then heated to convert the platinum to platinum silicide and the excess platinum is removed by etching with aqua regia. All of the sputtering processes for making these contacts occur at temperatures substantially below 500°C and, hence, no substantial change in junction position occurs. Since the silicon nitride was used as a mask to protect the base regions during removal of the emitter and collector regions for deposition, the second accurate masking step heretofore required for shallow junctions has been eliminated, thereby further increasing the yield potential of the process for high production reproducibility of wafers.

In addition, all of the oxide layer 26 covering the emitter junction and out to the edge of the contact apertures in the oxide layer 26 is covered by layer 28. Layer 26 acts as a surface passivation layer and must remain uncontaminated with stray contaminants, such as sodium ions, particularly in the region where layer 26 covers the junction. Layer 28 acts as a barrier layer to prevent migration of contaminants, such as sodium ions, which can migrate through oxide layers, to the semiconductor surface at the emitter junctions. Thus, the previous practice of using a second precision masking step to open a smaller hole in the oxide layer grown during emitter diffusion leaves areas over the junction not covered by the barrier layer 28. While subsequent metallization can be made to overlie the whole emitter and oxide area, a tortuous path through the oxide layers 30 and 26 to the junction surface from the outside source of contaminants still exists. In accordance with this invention, however, the subsequent metallization substantially seals against the barrier layer 28 which covers all of layer 26 and prevents such contamination.

Metallization layers are applied in accordance with the aforementioned copending application. A first layer comprises a metal strap 42 connected between the collector contact 36 of one transistor 44 and the base contact 40 of the other transistor 45 of a bipolar memory cell. Emitters 34 of each transistor are connected together by strap 46. Emitters 32 of the transistor are connected to conductive straps 48 which connect with other cells and data input and/or output buses (not shown). The collectors of the transistors are connected through the bulk resistances 50 of the epitaxial layer 12 to contacts 38 and thence to straps 52.

A horizontal power bus 54 is in the second layer of conductors separated from the first layer of conductors by insulating layer 56 which may be, for example, thermally grown oxide several thousand Angstroms thick. The second layer of conductors comprises the horizontal bus 54 connected to straps 52 through apertures in layer 56 at points 58 and a horizontal bus 60 connected to strap 46 through apertures in layer 56 at points 62.

The second layer of metal buses 54 and 60 preferably is bonded to the insulating layer 56 by a layer formed from an active metal oxide, such as an oxide of titanium, which may be applied to the layer 56 by any desired means in accordance with well-known practice, such as sputter or vacuum deposition. The titanium oxide adheres strongly to the insulating layer, and subsequent layers of gold, platinum or other metals are then deposited thereon and adhere strongly thereto.

The metallization forms conductors having portions which may, if desired, be supported on the sloped walls of the regions 16 and 18 where they cross such regions. Since the walls of the grooves 16 and 18 lie at a predetermined angle of 54° to 56° from the horizontal, layers of insulation and/or metallization may be formed readily by well-known sputtering or evaporation techniques substantially uniformly on such sloped walls, thereby providing continuous contact where desired in, over and/or across the grooves 16 and 18.

Figure 4:
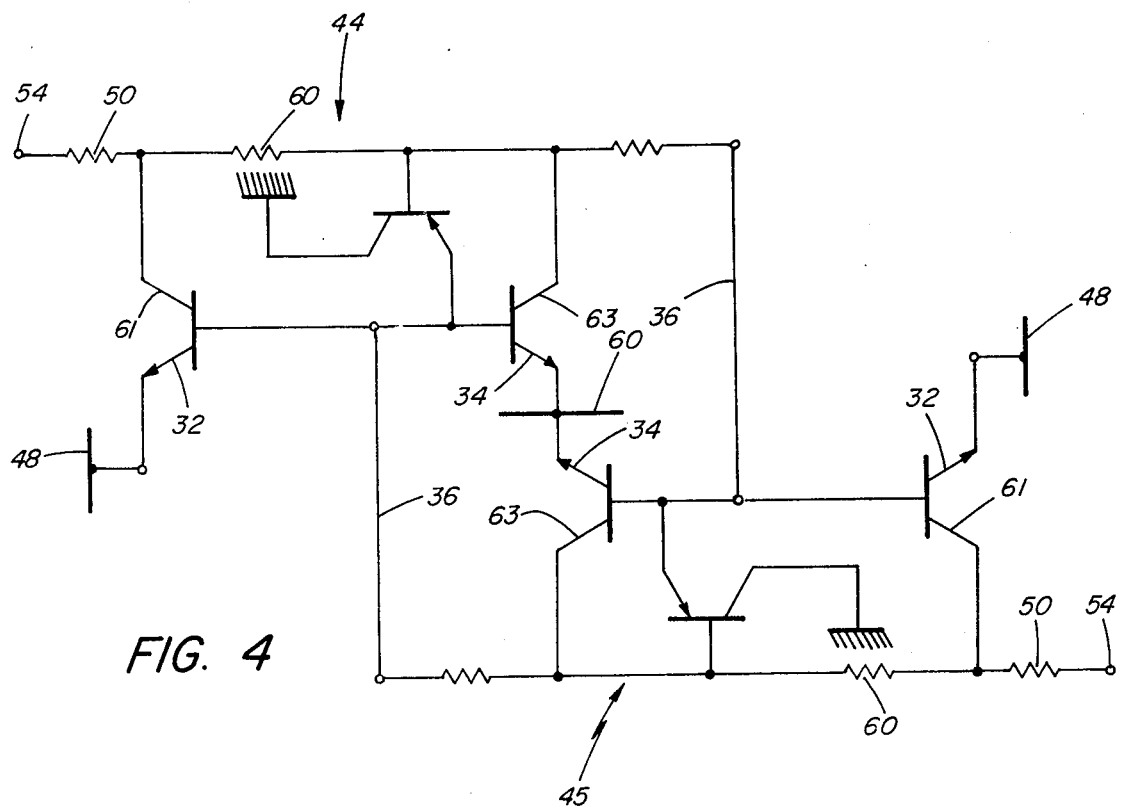
FIG. 4 illustrates a schematic diagram of the circuit of FIG. 1.

As shown in FIG. 4, resistors 60, formed by the collector regions extending between emitter regions 32 and 36, are effectively connected between the collector regions 61 and 63 of each transistor, forming two transistor portions with different collector resistance values. Resistors 60 preferably have a value on the order of 14,000 ohms, resistors 50 which are connected from a power source to collectors 61 are adjusted by adjusting the path through the bulk resistance of the portion of region 12 lying between the collectors 61 and the resistor terminals contacted by strap 52 and preferably have a value on the order of 6,000 ohms. The emitter contacts 34 are connected by straps 46 to a word enable supply bus 60. The bus 60 may be driven up and down by a driver (not shown) which may also drive bus 54 up and down to maintain a substantially fixed voltage difference between these buses and to shift their potential level by about one volt with respect to emitters 32 during operation of the circuit. The emitters 32 are coupled to a pair of readwrite circuits (not shown) for coupling data into and out of the circuit.

The circuit thus illustrated is a latching flip-flop transistor circuit which may be operated to store information and to read out stored information.

It should be clearly understood that the circuit illustrated herein can be operated in any desired fashion, and its layout as an integrated circuit structure is by way of example only since it is contemplated that any desired circuit or circuit configuration can be used in accordance with this invention.

This completes the description of the particular embodiment of the invention illustrated herein. However, many modifications thereof will be apparent to persons skilled in the art without departing from the spirit and scope of the invention. For example, electrical elements, such as microwave transistors, may be formed in accordance with the teaching of this invention, and any desired semiconductor circuit can be laid out using these principles. In addition, MOS structures for field effect devices may be made with this invention and any desired materials can be used for the passivation and barrier layers. Accordingly, it is contemplated the scope of this invention be not limited to the particular details of the embodiment illustrated herein except as defined by the apppended claims.

What is claimed is:

1. The method of forming one or more junction regions in a semiconductor body comprising:
    diffusing an impurity from an oxidizing atmosphere thru an apertured multilayered mask on said semiconductor body, said mask comprising at least one insulating layer adjacent said body;
    subjecting said body to R.F. sputtering to remove material formed in the aperture of said mask during said diffusion with said insulating layer covering the surface junctions of said junction regions with the remainder of said semiconductor body while central surface portions of said junction regions are exposed through said insulating layer; and
    forming ohmic contacts to said central portions of said junction regions without removing said insulating layer.

2. The method in accordance with claim 1 wherein said semiconductor body is formed by the process comprising:
    forming a substrate of a first conductivity type; and
    growing an epitaxial layer of a second conductivity type on said substrate.

3. The method in accordance with claim 2 wherein the surface of said layer lies in the [100] crystallographic plane.

4. The method in accordance with claim 3 wherein a plurality of junction elements are formed in said layer and isolation regions are formed between said elements by preferentially etching said regions from said crystallographic surface through said epitaxial layer.

5. The method in accordance with claim 4 wherein the walls of said isolation regions are formed substantially in the [111] crystallographic surface planes.

6. The method in accordance with claim 1 wherein said body is formed by the steps comprising:
   forming a substrate of a first conductivity type;
   diffusing a zone of a second conductivity type into said substrate; and
   growing a layer of said second conductivity type epitaxially on said substrate.

7. The method in accordance with claim 6 and further comprising:
   diffusing a region of said first conductivity type into said layer in selected regions thereof.

8. The method in accordance with claim 1 and further comprising:
   forming said insulating layer of a passivation layer and a barrier layer.

9. The method in accordance with claim 8 wherein said body comprises silicon, said passivation layer comprises silicon dioxide, and said barrier layer comprises silicon nitride.

10. The method in accordance with claim 1 wherein said step of forming said ohmic contact comprises:
    chemically removing material deposited on said body during said sputtering process; and
    depositing metal in said apertures.

11. The method of forming a semiconductor structure comprising:
    forming a semiconductor body with a plurality of regions separated by intervening isolation regions where semiconductor material has been removed to expose the [111] crystallographic planes;
    diffusing an impurity from an oxidizing atmosphere thru an apertured multilayered mask on said semiconductor body, said mask comprising at least one insulating layer adjacent said body;
    subjecting said body to R.F. sputtering to remove material formed in the apertures of said mask during said diffusion with said insulating layer covering the surface junctions of said junction regions with the remainder of said semiconductor body while central surface portions of said junction regions are exposed through said insulating layer; and
    forming ohmic contacts to said central portions of said junction regions without removing said insulating layer.

12. The method in accordance with claim 11 wherein said step of forming said semiconductor body comprises:
    forming a substrate of a first conductivity type; and
    growing an epitaxial layer of a second conductivity type on said substrate.

13. The method in accordance with claim 12 wherein said step of growing said epitaxial layer comprises:
    growing the surface of said layer in the [100] crystallographic plane.

14. The method in accordance with claim 13 wherein said step of diffusing junction regions comprises:
    forming a plurality of junction elements in said layer with said isolation regions positioned between said elements.

15. The method in accordance with claim 14 wherein said step of forming said semiconductor body with said isolation regions comprises:
    preferentially etching said regions from the surface of said epitaxial layer through said epitaxial layer to form the walls of said isolation regions substantially in said [111] crystallographic surface planes.

16. The method in accordance with claim 11 wherein said step of forming said body comprises:
    forming a substrate of a first conductivity type;
    diffusing a zone of a second conductivity type into said substrate; and
    growing a layer of said second conductivity type epitaxially on said substrate.

17. The method in accordance with claim 16 wherein said step of forming said body further comprises:
    diffusing a region of said first conductivity type into said layer in selected regions thereof.

18. The method in accordance with claim 11 wherein said step of diffusing junction regions through apertures in an insulating layer comprises:
    forming said insulating layer of a passivation layer and a barrier layer.

19. The method in accordance with claim 18 wherein said step of forming said body comprises:
    forming said body of semiconductor material comprising silicon;
    forming said passivation layer of insulating material comprising silicon dioxide; and
    forming said barrier layer of insulating material comprising silicon nitride.

* * * * *